(12) United States Patent
Ohsawa et al.

(10) Patent No.: US 9,290,842 B2
(45) Date of Patent: Mar. 22, 2016

(54) ELECTRODE COVER AND EVAPORATION DEVICE

(71) Applicant: SEMICONDUCTOR ENERGY LABORATORY CO., LTD., Atsugi-shi, Kanagawa-ken (JP)

(72) Inventors: Nobuharu Ohsawa, Kanagawa (JP); Ryoji Nomura, Kanagawa (JP); Masahiro Takahashi, Kanagawa (JP)

(73) Assignee: Semiconductor Energy Laboratory Co., Ltd., Kanagawa-ken (JP)

(*) Notice: Subject to any disclaimer, the term of this patent is extended or adjusted under 35 U.S.C. 154(b) by 0 days.

(21) Appl. No.: 14/077,385

(22) Filed: Nov. 12, 2013

(65) Prior Publication Data

US 2014/0056579 A1 Feb. 27, 2014

Related U.S. Application Data

(63) Continuation of application No. 11/790,383, filed on Apr. 25, 2007, now Pat. No. 8,608,855.

(30) Foreign Application Priority Data

Apr. 28, 2006 (JP) ................. 2006-126794

(51) Int. Cl.
*C23C 16/00* (2006.01)
*C23C 16/448* (2006.01)
*C23C 14/24* (2006.01)
*C23C 14/26* (2006.01)
*H05B 3/03* (2006.01)

(52) U.S. Cl.
CPC ............. *C23C 16/448* (2013.01); *C23C 14/243* (2013.01); *C23C 14/26* (2013.01); *H05B 3/03* (2013.01)

(58) Field of Classification Search
CPC ................................ C23C 14/24; C23C 14/26
USPC .................................................. 118/726, 727
See application file for complete search history.

(56) References Cited

U.S. PATENT DOCUMENTS

| | | | | | |
|---|---|---|---|---|---|
| 2,411,715 | A | * | 11/1946 | Dimmick | 118/720 |
| 2,447,979 | A | * | 8/1948 | Hensel et al. | 420/497 |
| 2,542,056 | A | | 2/1951 | Ravenscroft | |
| 2,569,468 | A | | 10/1951 | Gaugler | |

(Continued)

FOREIGN PATENT DOCUMENTS

| | | |
|---|---|---|
| EP | 1 071 117 A2 | 1/2001 |
| JP | 50-155351 | 12/1975 |

(Continued)

*Primary Examiner* — Keath Chen
(74) *Attorney, Agent, or Firm* — Nixon Peabody LLP; Jeffrey L. Costellia

(57) ABSTRACT

The present invention provides an evaporation device for which maintenance is readily conducted, and further, provides an electrode cover which can prevent an evaporation material from being adhered to electrodes. Moreover, the present invention provides an evaporation device including an evaporation chamber; a holding portion for holding an object to be treated; an evaporation source; an electrode; an electrode cover; and a power supply, in which the evaporation chamber includes the holding portion in an upper portion, and includes the evaporation source, the electrode, and the electrode cover in a lower portion; the electrode cover covers at least a part of an exposed surface of the electrode; the electrode and the power supply are electrically connected.

16 Claims, 11 Drawing Sheets

(56) References Cited

U.S. PATENT DOCUMENTS

| | | | |
|---|---|---|---|
| 2,579,973 A | 12/1951 | Schlosser | |
| 2,724,663 A * | 11/1955 | Bond | 427/593 |
| 2,740,101 A | 3/1956 | Betts | |
| 3,387,116 A | 6/1968 | Dupuis | |
| 3,407,783 A | 10/1968 | Capita | |
| 3,617,348 A * | 11/1971 | Kelley et al. | 438/679 |
| 3,667,424 A * | 6/1972 | Cornelius et al. | 118/720 |
| 3,760,338 A | 9/1973 | Bruels | |
| 4,526,132 A | 7/1985 | Ohta | |
| 4,944,245 A | 7/1990 | Stoessl et al. | |
| 5,068,915 A * | 11/1991 | Heinz et al. | 392/389 |
| 5,099,791 A * | 3/1992 | Tsukazaki et al. | 118/723 CB |
| 5,135,629 A | 8/1992 | Sawada et al. | |
| 5,886,863 A | 3/1999 | Nagasaki et al. | |
| 6,776,880 B1 | 8/2004 | Yamazaki | |
| 7,048,562 B2 | 5/2006 | Lutsch et al. | |
| 7,914,620 B2 * | 3/2011 | Chi | 118/726 |
| 2002/0096117 A1 | 7/2002 | Futamura et al. | |
| 2003/0180457 A1 | 9/2003 | Murakami et al. | |
| 2004/0031442 A1 | 2/2004 | Yamazaki et al. | |
| 2004/0035360 A1 | 2/2004 | Yamazaki et al. | |
| 2004/0113160 A1 | 6/2004 | Oshima | |
| 2004/0142185 A1 * | 7/2004 | Takushima | 428/447 |
| 2004/0216673 A1 | 11/2004 | Sakata et al. | |
| 2005/0048851 A1 | 3/2005 | Okita et al. | |
| 2006/0013966 A1 * | 1/2006 | Koninckx et al. | 427/593 |
| 2006/0162647 A1 | 7/2006 | Chi | |

FOREIGN PATENT DOCUMENTS

| | | |
|---|---|---|
| JP | 53-040692 | 4/1978 |
| JP | 62-064767 | 4/1987 |
| JP | 2001-102170 | 4/2001 |
| JP | 2002-285325 | 10/2002 |
| JP | 2004-043965 | 2/2004 |
| JP | 2004-047452 | 2/2004 |
| JP | 2004-263299 | 9/2004 |

\* cited by examiner

ELECTRODE COVER AND EVAPORATION DEVICE

BACKGROUND OF THE INVENTION

1. Field of the Invention

The present invention relates to thin film formation devices. Specifically, the present invention relates to evaporation devices having a mechanism which can form a film using a material by an evaporation method. The material is a material which can be formed as a film by an evaporation method.

2. Description of the Related Art

In recent years, thin and flat display devices have been needed as display devices in televisions, cellular phones, digital cameras, and the like, and as the display devices satisfying this need, display devices using self-light emitting elements have attracted attention. One of the self-light emitting elements is a light emitting element utilizing electroluminescence (EL), and this light emitting element includes a light emitting material interposed between a pair of electrodes and can provide light emission from the light emitting material by voltage application.

Such self-light emitting elements have advantages over liquid crystal display elements, such as high visibility of the pixels and no need of backlight and are considered suitable as flat panel display elements. Another major advantage of such light emitting elements is that they can be manufactured to be thin and lightweight. In addition, extremely high response speed is also one of the features.

Further, such a self-light emitting element can be formed into a film shape; therefore, surface light emission can be easily obtained by formation of a large-area element. Since this feature is hard to obtain from a point light source typified by an incandescent light bulb or an LED, or a linear light source typified by a fluorescent lamp, the self-light emitting element has high utility as an area light source which is applicable to a lighting system or the like.

Light emitting elements utilizing electroluminescence are classified according to the type of a light emitting material, that is, an organic compound or an inorganic compound. In general, the former is referred to as an organic EL element, the latter as an inorganic EL element.

Light-emitting materials which are used for organic EL elements using an organic compound are classified into high molecular compounds (polymer) and low molecular compounds (monomer). Such high molecular compound materials are formed as a film by a wet method such as a spin coating method or an inkjet method, while such low molecular compound materials are formed mainly by an evaporation method.

In general, evaporation devices have a holding portion for holding a substrate and an evaporation source holder for holding an evaporation material. In an evaporation device using a resistance heating method, an evaporation source holder is placed between electrodes, and a current is made to flow in a boat, a crucible, a filament or the like in which an evaporation material is held, with use of the electrodes, to heat the evaporation material, thereby forming a film.

However, such electrodes are positioned near a boat, a crucible, and a filament or the like, in which an evaporation material is held, and thus, there is a problem in that an evaporation material is adhered to the electrodes at the time of evaporation. Therefore, when another material is evaporated, maintenance is needed to prevent contamination, in which the electrodes are cleaned to remove the material adhered to the electrodes.

In addition, a large evaporation device has large electrodes and large weight. In addition, in case of an evaporation device having a plurality of evaporation source holders, since it has a plurality of pairs of electrodes, a large amount of labor is needed for washing the electrodes. Such electrodes are needed to be fixed on a plate on which an evaporation source holder is set; and such electrodes are preferably fixed thereon from beneath such a plate so that the fixed portion is prevented from being contaminated. However, when the electrodes are fixed with a screw from beneath the plate on which an evaporation source holder is set, is also needed to be removed together with the electrodes to remove the electrodes for cleaning. The plate for fixing weighs 20 to 30 kg in some cases, and thus, it is hard work to remove materials attacked to the electrodes. When an evaporation device having a plurality of evaporation sources is used, a plate having a plurality of evaporation source holders weighs more and the work operation is harder.

SUMMARY OF THE INVENTION

Accordingly, it is an object of the present invention to provide an evaporation device for which maintenance is readily conducted. In addition, it is another object of the present invention to provide an electrode cover which can prevent an evaporation material from being adhered to an electrode.

An aspect of the present invention is an electrode cover which covers at least a part of an exposed surface of an electrode. In particular, the electrode cover preferably covers a face of the electrode, the face fronting the evaporation source.

More preferably, the electrode cover covers the whole exposed surface of the electrode. Note that a connection portion of each part of the electrode or a portion for connecting the electrode and a power supply is not needed to be covered.

In other words, another aspect of the present invention is an electrode cover which covers at least a part of an exposed surface of an electrode holding an evaporation source.

Another aspect of the present invention is an electrode cover which covers at least a face fronting the evaporation source of an exposed surface of an electrode holding the evaporation source.

In the above structures, the electrode cover is preferably formed using a material having a high heat-resistance. Further, when an electrode is constituted by plural parts and an electrode cover is provided between the parts, the electrode cover preferably comprises a conductive material. Alternatively, when an electrode cover is not provided between parts of the electrode, the electrode cover may comprise a material having a higher temperature limit of heat-resistance than a temperature at the time of evaporation (evaporation temperature), without being limited to conductive materials.

Further, another aspect of the present invention is an evaporation device using the electrode cover.

In other words, an aspect of the present invention is an evaporation device including an evaporation source holder for holding an evaporation source; and an electrode for heating the evaporation source; and an electrode cover which covers at least a part of an exposed surface of the electrode is provided.

In addition, another aspect of the present invention is an evaporation device including an evaporation source holder for holding an evaporation source; and an electrode for heating the evaporation source; and an electrode cover which covers at least a face fronting the evaporation source of an exposed surface of the electrode is provided.

Further, another aspect of the present invention is an evaporation device including an evaporation chamber; a holding portion for holding an object to be treated; an evaporation source holder for holding an evaporation source; an electrode for heating the evaporation source; an electrode cover; and a power supply, wherein the evaporation chamber includes the holding portion in the upper part, and includes the evaporation source holder, the electrode, and the electrode cover in the lower part; the electrode cover covers at least a part of an exposed surface of the electrode; the electrode and the power supply are electrically connected; the evaporation source holder and the power supply are electrically connected; and the evaporation source holder is heated by resistance heating so that a material held in the evaporation source holder is deposited to the object to be treated which is held above the evaporation source holder. Note that the power supply may be provided in the outside of the evaporation chamber.

In addition, another aspect of the present invention is an evaporation device including an evaporation chamber; a holding portion for holding an object to be treated; an evaporation source holder for holding an evaporation source; an electrode for heating the evaporation source; an electrode cover; and a power supply, wherein the evaporation chamber includes the holding portion in the upper part, and includes the evaporation source holder, the electrode, and the electrode cover in the lower part; the electrode cover covers at least a face fronting an evaporation source side of an exposed surface of the electrode; the electrode and the power supply are electrically connected; the evaporation source holder and the power supply are electrically connected; and the evaporation source holder is heated by resistance heating so that a material held in the evaporation source holder is deposited to the object to be treated which is held above the evaporation source holder.

In the above structures, the electrode cover preferably covers the whole exposed surface of the electrode. Note that a connection portion of parts of the electrode or a portion for connecting the electrode and the power supply is not needed to be covered.

In addition, in the above structures, the electrode cover preferably comprises a material having a high heat-resistance. Further, when an electrode is constituted by plural parts and an electrode cover is provided between the parts, the electrode cover preferably comprises a conductive material. Alternatively, when an electrode cover is not provided between parts of the electrode, the electrode cover may comprise a material having a higher temperature limit of heat-resistance than a temperature at the time of evaporation (evaporation temperature), without being limited to conductive materials.

An electrode cover of the present invention is used, thereby preventing an evaporation material from being adhered to electrodes in an evaporation device.

Providing an electrode cover allows maintenance of an evaporation device to be easier, since the electrode cover can be detached in order to remove an evaporation material adhered to electrodes. Further, it leads to increase in productivity of products which are manufactured with the evaporation device since the maintenance becomes easy and the process time can be shortened.

DETAILED DESCRIPTION OF THE INVENTION

Hereinafter, Embodiment Modes of the present invention will be described with reference to the drawings. Note that the present invention can be carried out in many different modes. It is easily understood by those skilled in the art that modes and details disclosed herein can be modified in various ways without departing from the spirit and the scope of the present invention. Therefore, it should be noted that the present invention should not be interpreted as being limited to the description of the embodiment modes given below.

In addition, the light emitting device in this specification includes image display devices, light emitting devices, and light sources (including a lighting system). Further, the light emitting device includes all of the following modules: modules in which a connector such as an FPC (Flexible Printed Circuit), a TAB (Tape Automated Bonding) tape, or a TCP (Tape Carrier Package) is attached to a panel; modules having a TAB tape or a TCP provided with a printed wiring board at the end thereof; and modules having an IC (Integrated Circuit) directly mounted on a light emitting device by a COG (Chip On Glass) method.

Embodiment Mode 1

Embodiment Mode 1 will describe an evaporation device and an electrode cover according to the present invention.

Figure 1A:
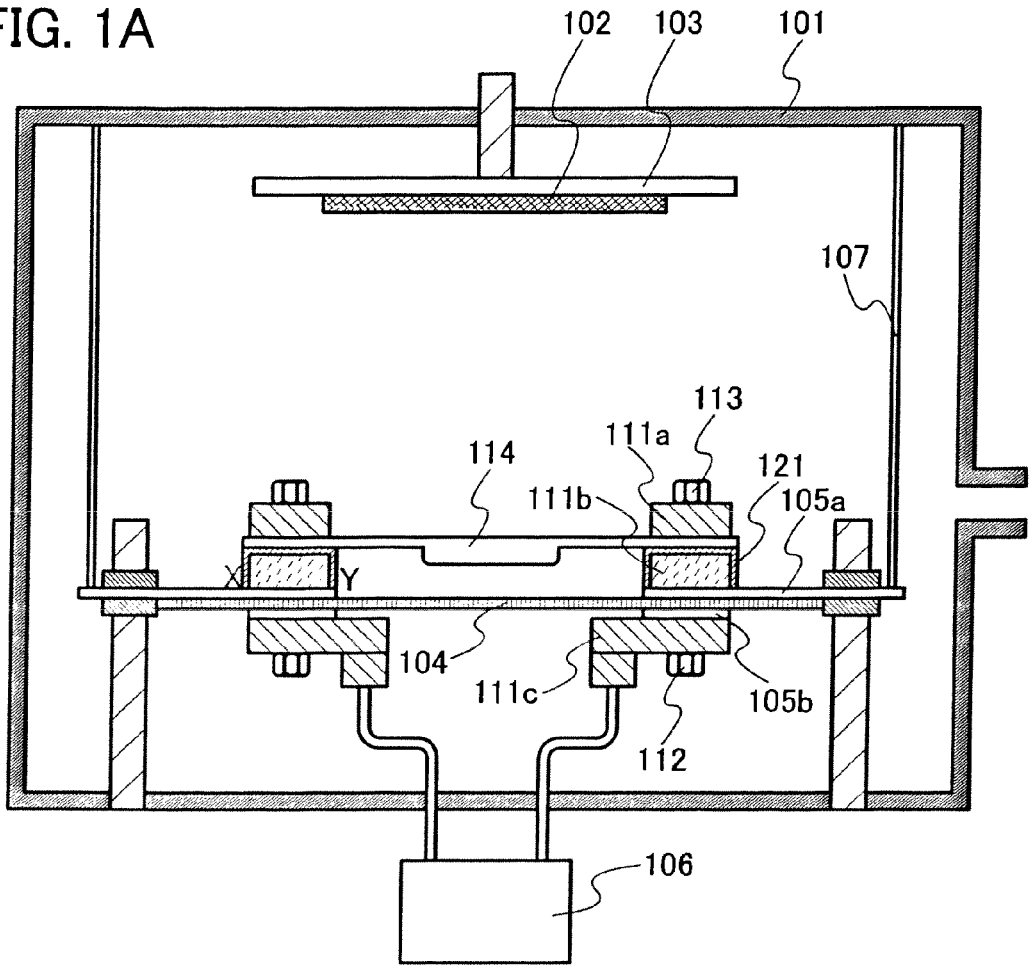
FIGS. 1A to 1D are views explaining an electrode cover and an evaporation device according to an aspect of the present invention.

FIGS. 1A to 1D show one mode of an evaporation device and an electrode cover according to the present invention. In FIG. 1A, the evaporation device includes a holding portion 103 for holding an object to be treated 102, a plate 104 on which an evaporation source holder is set, and the evaporation source holder 114 in an evaporation chamber 101. An evaporation material held by the evaporation source holder 114 is heated to form a film of the evaporation material on a surface of the object to be treated held thereover. In FIG. 1A, a plate for preventing attachment 107 is provided in order to prevent the evaporation material from spreading in the whole evaporation chamber at the time of evaporation. The evaporation source holder 114 is electrically connected to a pair of electrodes, each of the electrodes comprising an upper part 111a, a middle part 111b, and a lower part 111c. And the middle part 111b of the electrode and the lower part 111c of the electrode are fixed on the plate 104 on which the evaporation source holder is set, with a screw 112. The middle part 111b of the electrode and the lower part 111c of the electrode are electrically connected to each other with the screw 112. The upper part 111a of the electrode is fixed on the middle part 111b of the electrode with a screw 113. The evaporation source holder holding the evaporation material or an end portion of the evaporation source holder including the evaporation material is interposed between the upper part 111a of the electrode and the middle part 111b of the electrode, so that the evaporation source holder 114 can be held. In addition, the electrodes and the evaporation source holder 114 can be electrically connected. The lower part 111c of the electrode which is fixed on the plate 104 on which the evaporation source holder is set can be connected to a power supply 106.

When the plate 104 on which the evaporation source holder is set comprises a conductive material, an insulating plate 105a is provided between the plate 104 and the middle part 111b of the electrode, and an insulating plate 105b is provided between the plate 104 and the lower part 111c of the electrode. The insulating plates 105a and 105b can prevent a short circuit between the pair of electrodes via plate 104.

Figure 8A:
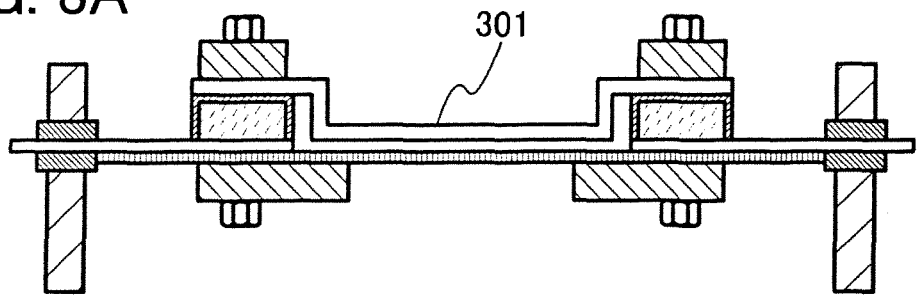
FIGS. 8A to 8C are views each explaining an evaporation source holder.
Figure 8B:
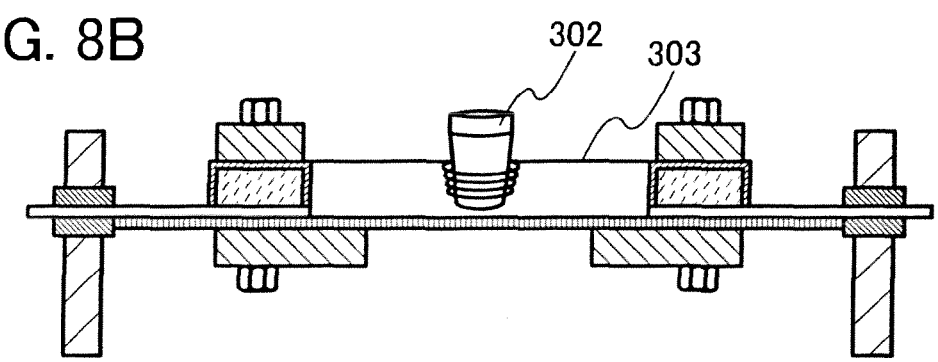
Figure 8C:
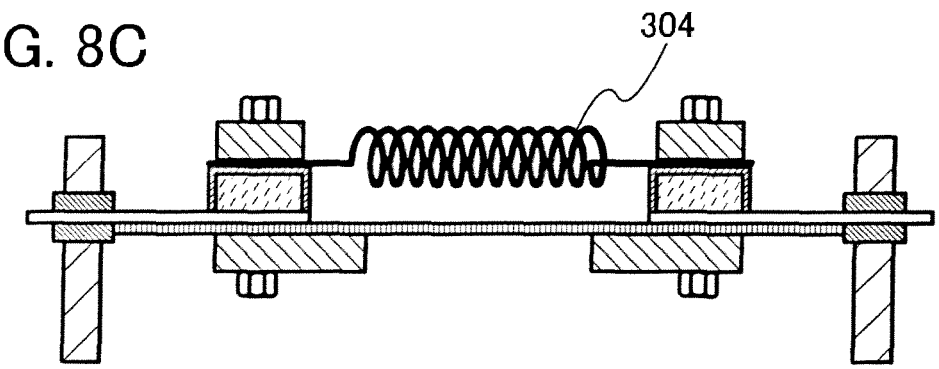
Figure 9A:
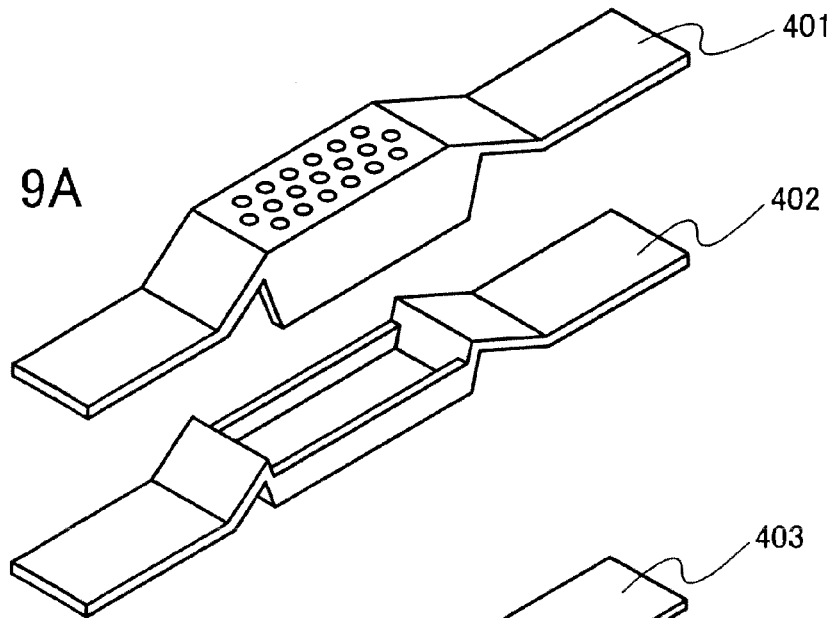
FIGS. 9A to 9C are views each explaining an evaporation source holder.
Figure 9B:
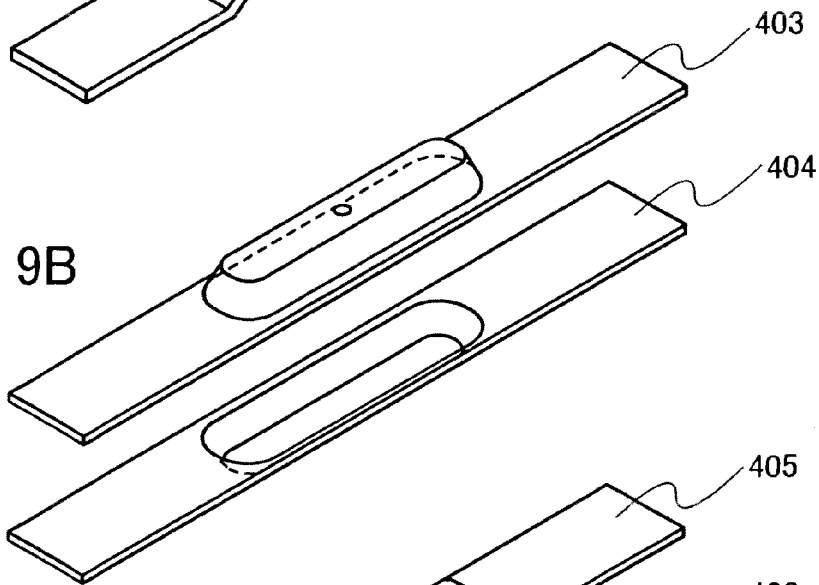
Figure 9C:
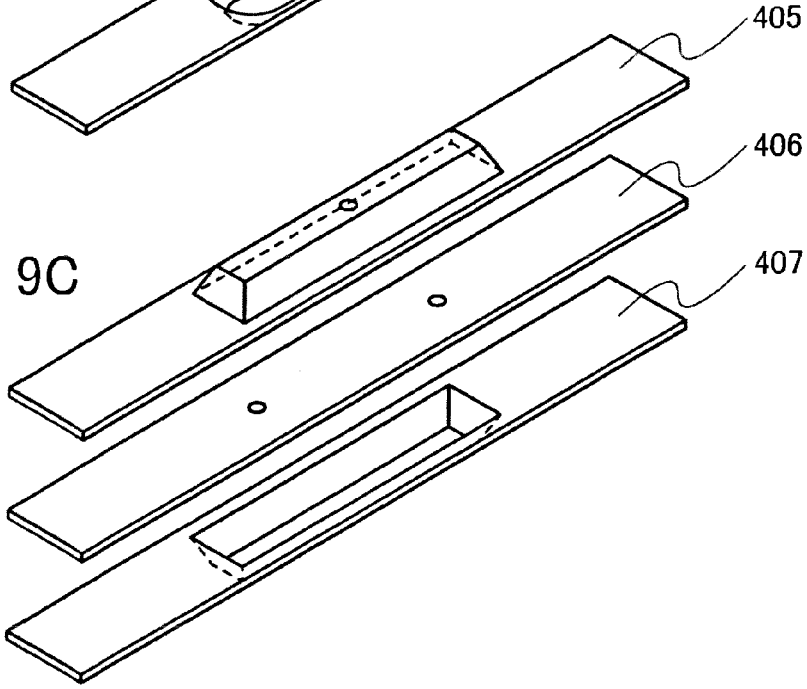

As the evaporation source holder, various types of evaporation source holders can be used. For example, a structure in which a boat 301 shown in FIG. 8A or a crucible shown in FIG. 8B is used and an evaporation material stored in such a boat or such a crucible is heated by a heating source 303, or a structure in which a filament 304 comprising an evaporation material as shown in FIG. 8C is used, may be adopted. In addition, a structure in which an evaporation material is held by a filament may be adopted. The boat, crucible or filament may have various shapes, for example, a boat which has an upper portion 401 and a lower portion 402 and plural holes in the upper portion as shown 401 in FIG. 9A, or a boat which has an upper portion 403 and a lower portion 404 and one hole in the upper portion 403 as shown in FIG. 9B can be used. Alternatively, a boat which has an upper portion 405, a middle portion 406 and a lower portion 407 and one hole in the upper portion 405 and two holes in the middle portion 406 as shown in FIG. 9C, can be used.

Figure 1B:
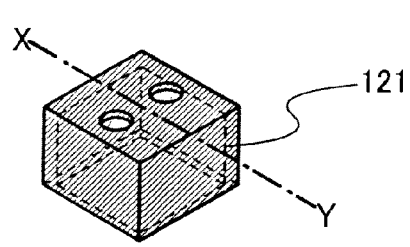
Figure 1D:
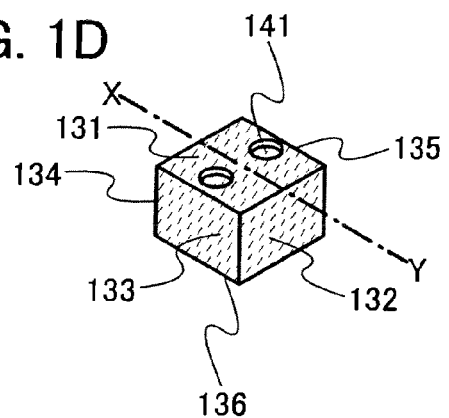
Figure 1C:
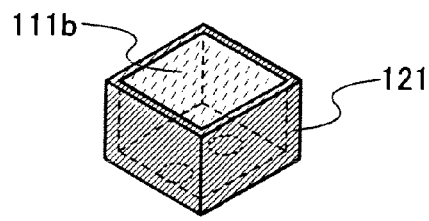

The middle parts 111b of the electrodes are covered by electrode covers 121. FIG. 1B is a perspective view of the electrode cover 121 seen from above, and FIG. 1C is a perspective view of the electrode cover 121 seen from beneath. FIG. 1D is a perspective view of the middle part 111b of the electrode seen from above. The sectioned face represented by X-Y in FIG. 1D corresponds to the cross section of the middle part 111b of the electrode in the left side of FIG. 1A. The middle part 111b of the electrode is electrically connected to the upper part 111a of the electrode with a screw 113, and the middle part 111b of the electrode has screw holes 141. In addition, the middle part 111b of the electrode shown in this embodiment mode includes a top face (a first face 131), a side face on the evaporation source side (a second face 132), a side face opposite to the evaporation source side (a fourth face 134), other side faces (a third face 133 and a fifth face 135), and a face fronting the side of the plate 104 on which the evaporation source holder is set (a sixth face 136) as shown in FIG. 1D.

The electrode cover shown in FIG. 1A is provided to cover the other faces than a face of the middle part 111b of the electrode fronting the plate 104 on which the evaporation source is set, and a portion for connecting each part of the electrode. The sectioned face represented by X-Y in FIG. 1B corresponds to a cross section of the middle part 111b of the electrode and the electrode cover 121 on the left side of FIG. 1A. In FIGS. 1B and 1C, the electrode cover 121 is provided to cover the other faces than the face fronting the plate 104 (the sixth face 136) and the screw hole 141. In other words, the electrode cover 121 covers the top face (the first face 131), the side face on the evaporation source side (the second face 132), the side face opposite to the evaporation source side (the fourth face 134), and the other side faces (the third face 133 and the fifth face 135) of the middle part of the electrode 111b.

The electrode cover is preferably formed using a conductive material. By using the conductive material, the electrode can be electrically connected to the evaporation source holder 114. In addition, since the evaporation source holder reached high temperature during evaporation, the electrode cover is preferably formed using a high heat resistant material. When an organic compound is evaporated, the electrode cover is preferably formed using a material having a melting point of 300° C. or higher. Further, when an inorganic compound whose evaporation temperature is higher than that of an organic compound is evaporated, the electrode cover is preferably formed using a material having a higher melting point, and the electrode cover is preferably formed using a material having a melting point of 900° C. or higher. For example, a metal such as copper (Cu), gold (Au), silver (Ag), or platinum (Pt), which has a high melting point and excellent conductivity can be used. Alternatively, an alloy may be used.

The electrode cover 121 has a screw hole for fixing the upper part 111a of the electrode on the upper side. Note that the screw 112 is formed using a conductive material so that the middle part 111b of the electrode and the lower part 111c of the electrode are electrically connected to each other.

Figure 2A:
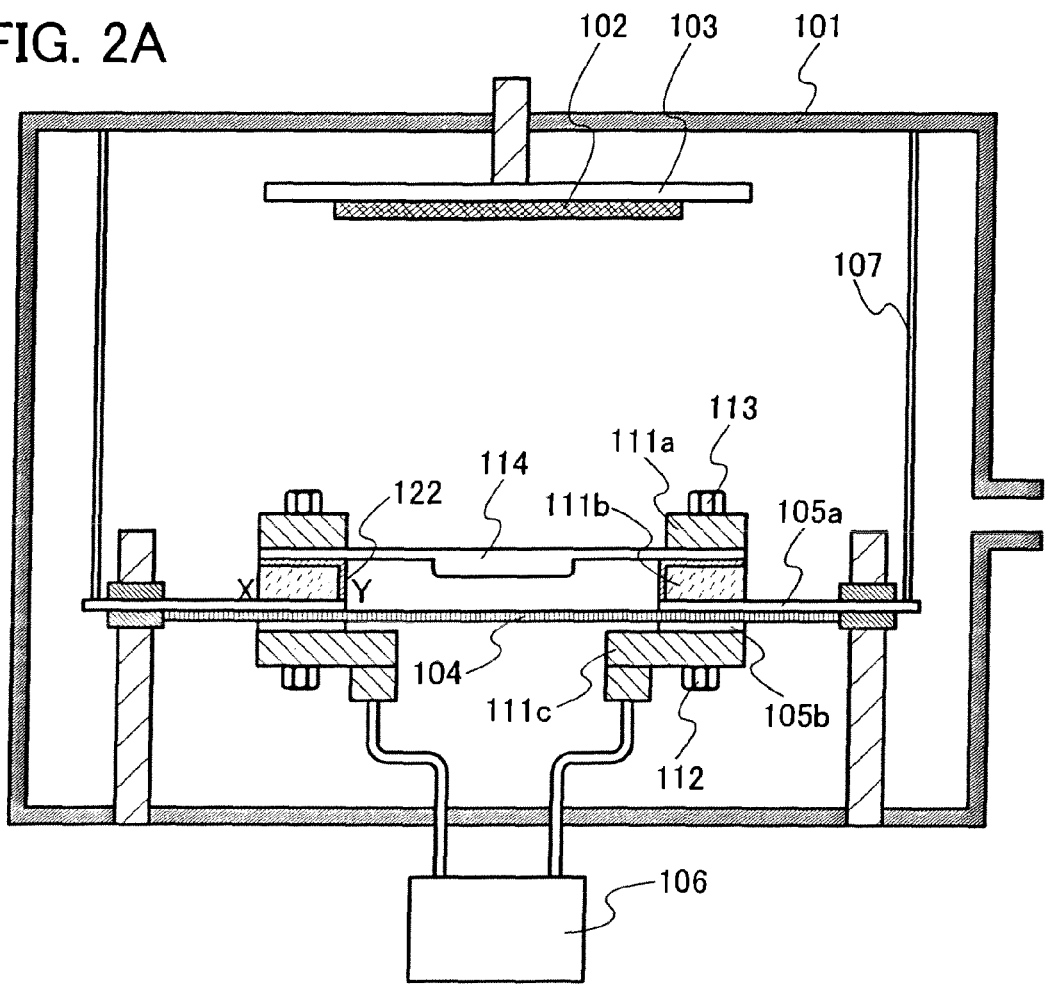
FIGS. 2A to 2D are views explaining an electrode cover and an evaporation device according to an aspect of the present invention.
Figure 2B:
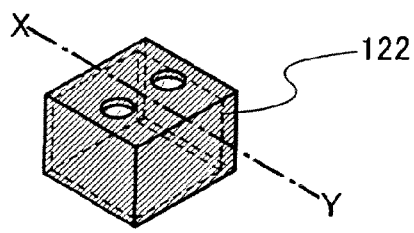
Figure 2D:
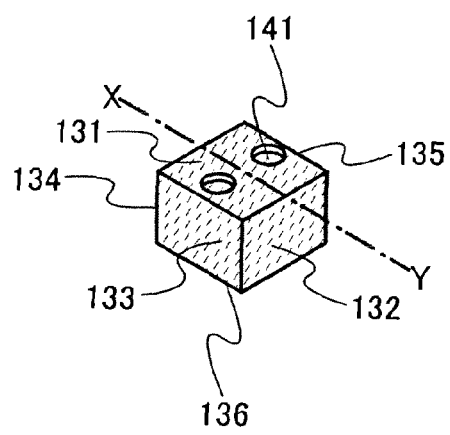
Figure 2C:
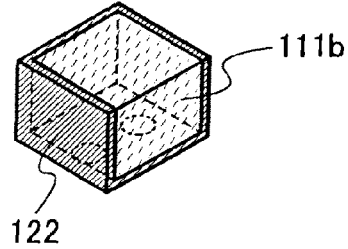

FIGS. 2A to 2C show an evaporation device using an electrode cover having a different shape from that shown in FIGS. 1A to 1C. FIG. 2B is a perspective view of the electrode cover 122 seen from above and FIG. 2C is a perspective view seen from beneath. FIG. 2D is a perspective view of the middle part 111b of the electrode. The sectioned face represented by X-Y in FIG. 2D corresponds to the cross section of the middle part 111b of the electrode in the left side of FIG. 2A. In FIGS. 2A to 2D, the electrode cover 122 is provided to cover the other faces than the face on the side opposite to the evaporation source side (the fourth face 134) and the face fronting the plate 104 (the sixth face 136). In other words, the electrode cover 122 covers the top face (the first face 131), the side face on the evaporation source side (the second face 132), and the side faces (the third face 133 and the fifth face 135) of the middle part 111b of the electrode.

Figure 3A:
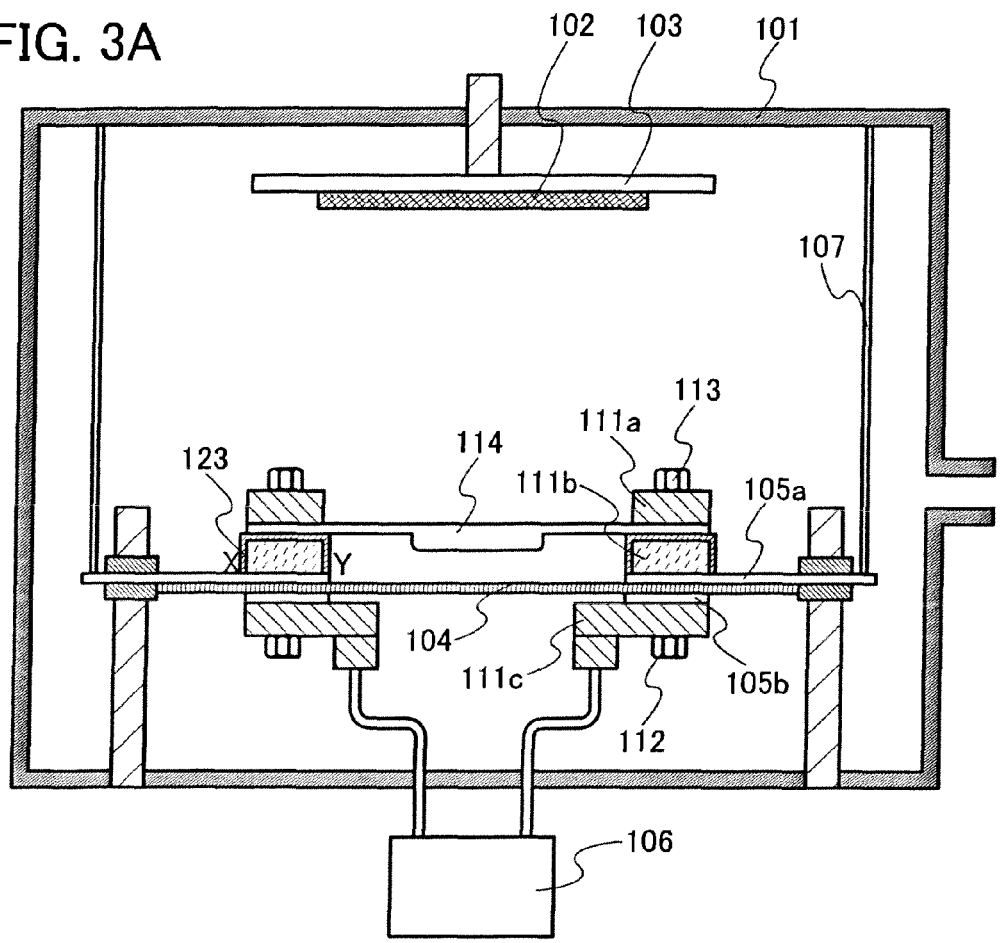
FIGS. 3A and 3C are views explaining an electrode cover and an evaporation device according to an aspect of the present invention.
Figure 3B:
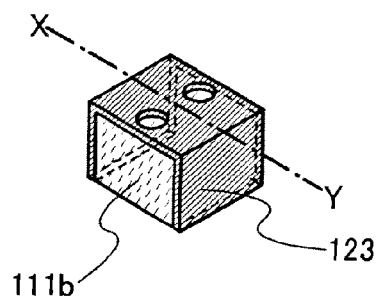
Figure 3C:
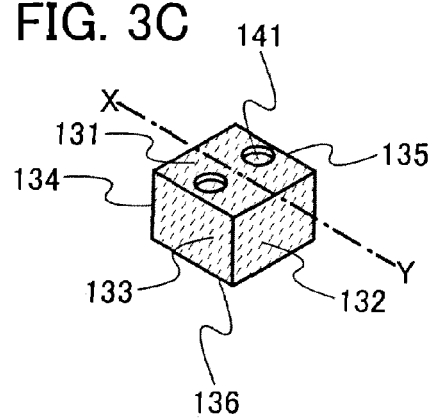

In addition, FIGS. 3A and 3C show a structure in which an electrode cover 123 covers the other faces than the side faces (the third face 133 and the fifth face 135) and the face fronting the plate 104 (the sixth face 136) of the middle part 111b of the electrode, as another example. In other words, the electrode cover 123 covers the face on the side opposite to the evaporation source side (the fourth face 134), the face on the evaporation source side (the second face 132), and the face on the upper part of the electrode side (the first face 131) of the middle part 111b of the electrode.

Figure 4A:
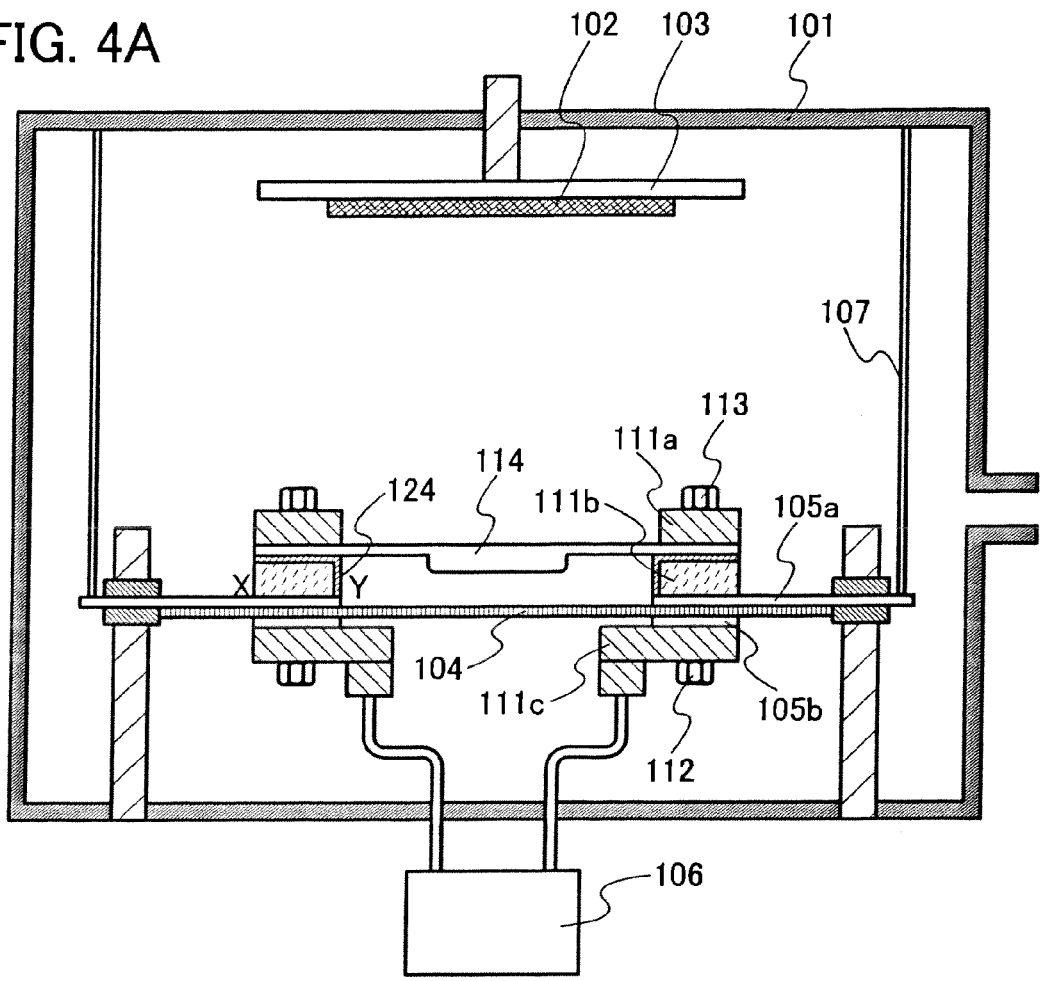
FIGS. 4A and 4C are views explaining an electrode cover and an evaporation device according to an aspect of the present invention.
Figure 4B:
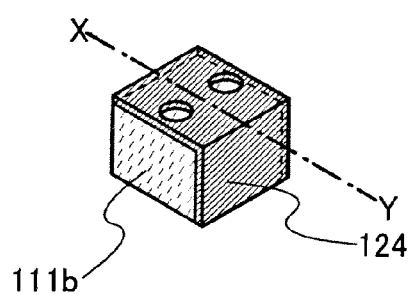
Figure 4C:
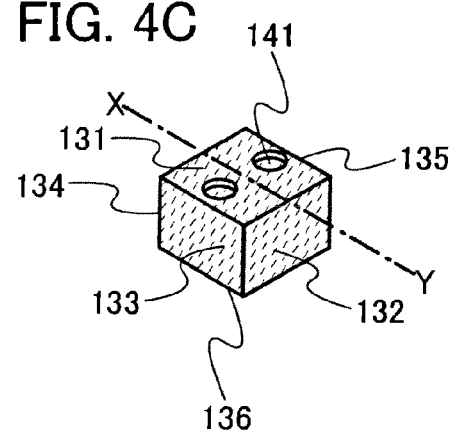

In addition, FIGS. 4A and 4C show a structure in which an electrode cover 124 covers the other faces than side faces (the third face 133 and the fifth face 135), the face on the side opposite to the evaporation source side (the fourth face 134), and the face fronting the plate 104 (the sixth face 136) of the middle part 111b of the electrode. In other words, the electrode cover 124 covers the face on the evaporation source side (the second face 132) and the face on the upper part of the electrode side (the first face 131) of the middle part 111b of the electrode.

Figure 5A:
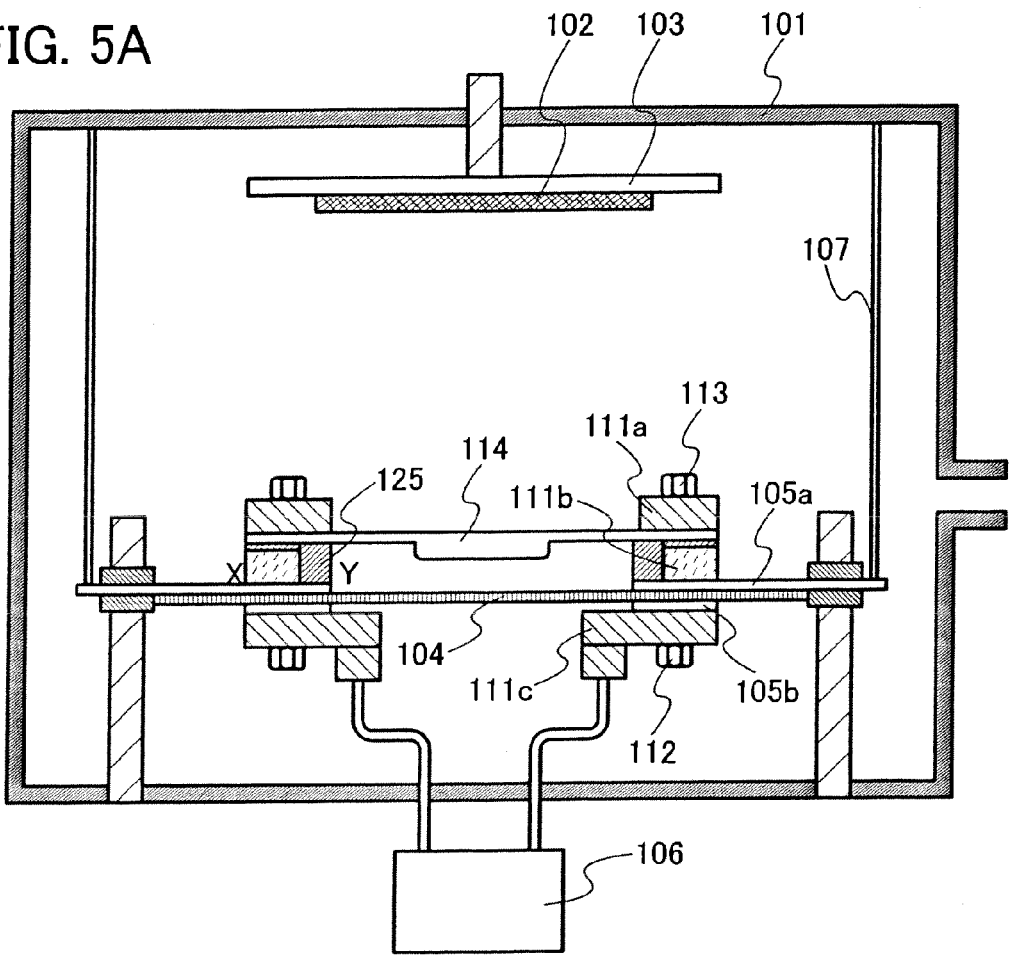
FIGS. 5A and 5C are views explaining an electrode cover and an evaporation device according to an aspect of the present invention.
Figure 5B:
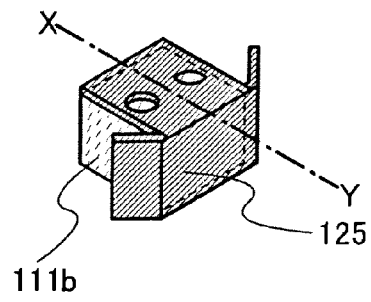
Figure 5C:
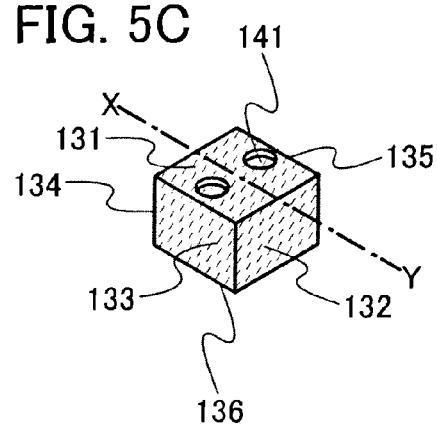

Moreover, FIGS. 5A and 5C show a structure in which the face on the evaporation source side (the second face 132) and the face on the upper part of the electrode side (the first face 131) of the middle part 111b of the electrode are covered, and a angled face for preventing attachment to side faces of the electrode (the third face 133 and the fifth face 135) are provided, as another example. Like the electrode cover 125 shown in FIGS. 5A and 5B, as long as attachment of the evaporation material to the electrodes can be prevented, the electrode cover is not needed to be in contact with the faces of the electrode.

Figure 6A:
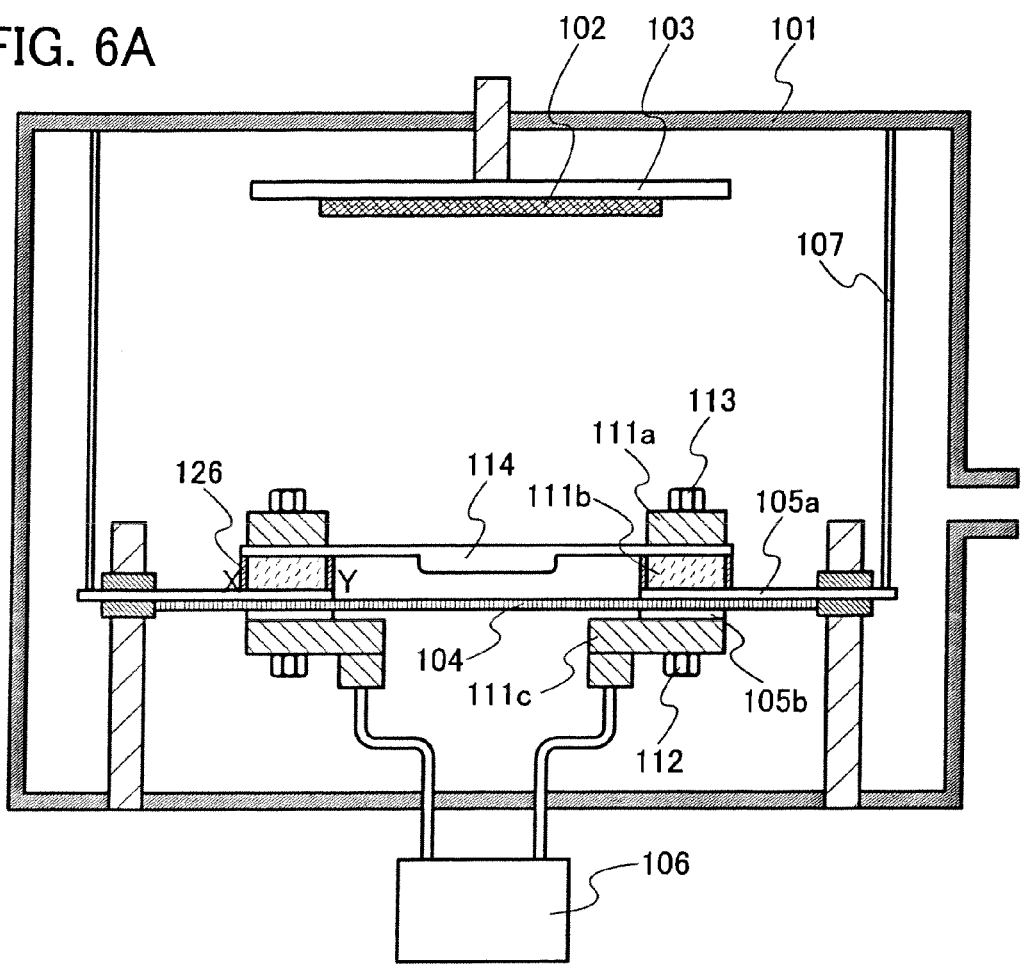
FIGS. 6A and 6C are views explaining an electrode cover and an evaporation device according to an aspect of the present invention.
Figure 6B:
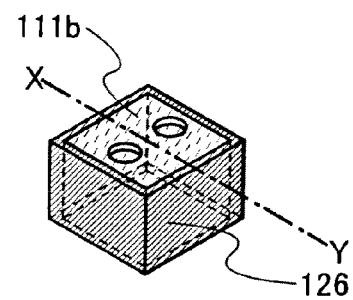
Figure 6C:
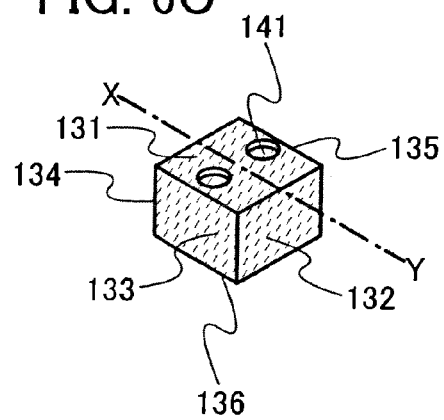

Moreover, FIGS. 6A and 6C show an electrode cover 126 which covers only side faces (the second face 132, the third face 133, the fourth face 134 and the fifth face 135) of the middle part 111b of the electrode. In other words, the electrode cover 126 covers the other faces than the face on the upper part of the electrode side (the first face 131) and the face on the lower part of the electrode side (the sixth face 136). In the case of the electrode cover which covers only side faces of the middle part 111b of the electrode, no cover is on the lower and upper faces of the middle electrode 111b, and thus, the electrode is electrically connected to an end portion of the evaporation source holder with no cover interposed therebetween. Thus, the electrode cover is not needed to have conductivity. Therefore, the electrode cover may be formed using a high heat resistant material, for example, ceramic or the like can be used. When an organic compound is evaporated, the electrode cover is preferably formed using a material having an allowable temperature limit of 300° C. or higher. Further, when an inorganic compound whose evaporation temperature is higher than that of an organic compound is evaporated, the electrode cover is preferably formed using a material having a higher heat-resistance, and the electrode cover is preferably formed using a material having an allowable temperature limit of 900° C. or higher.

Figure 7A:
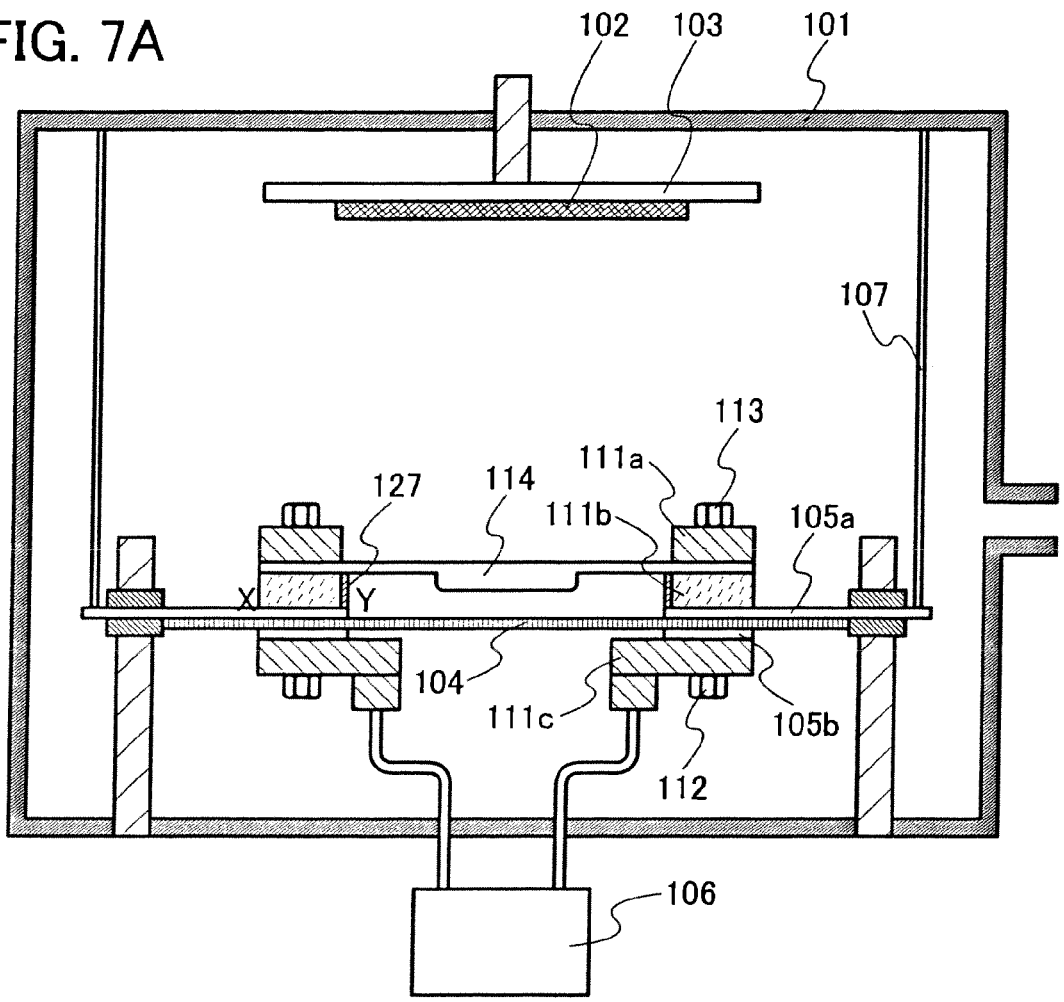
FIGS. 7A and 7C are views explaining an electrode cover and an evaporation device according to an aspect of the present invention.
Figure 7B:
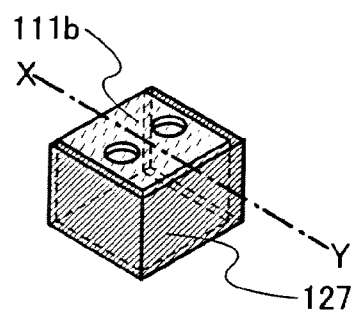
Figure 7C:
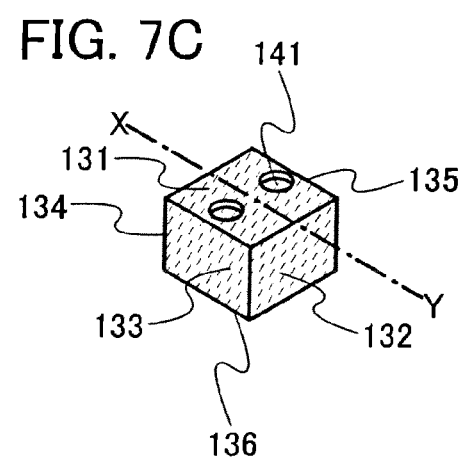

In addition, FIGS. 7A and 7C show an electrode cover 127 which covers the other faces than the face on the side opposite to the evaporation source side (the fourth face 134), the face fronting the plate 104 (the sixth face 136), and the face on the upper part of the electrode side (the first face 131) of the middle part 111b of the electrode. In other words, the electrode cover 127 covers the face on the evaporation source side (the second face 132) and the side faces (the third face 133 and the fifth face 135) of the middle part 111b of the electrode The electrode cover 127 shown in FIGS. 7A and 7B has no cover on the lower and upper sides of the middle part of the electrode, similarly to the electrode cover 126 shown in FIGS. 6A and 6B. Thus, the electrode cover 127 is not needed to have conductivity.

As described above, since the electrode cover of the present invention prevents attachment of the evaporation material to the electrode, the electrode cover is preferably provided to cover at least a part of the exposed surface of the electrode. In particular, the electrode cover is preferably formed to cover a face on the evaporation source side of the electrode.

Note that the electrode cover can be used for not only the middle part of the electrode but also the upper part of the electrode. When the electrode cover is used for the upper part of the electrode, adhesion of the evaporation material to the upper part of the electrode can be prevented. In addition, when a plurality of electrode covers are used, the number of cleaning electrodes can be decreased, and thus, maintenance work becomes simple and easy. Moreover, the electrode cover may be disposable. In other words, after an electrode cover is used, the electrode cover may be disposed without cleaning. In that case, the electrode cover is preferably formed using an inexpensive material. In addition, when the electrode cover is formed with a thin film, the electrode cover can be formed at lower cost.

Note that there is no particular limitation on the shape of the electrode. In addition, the electrode cover may be designed appropriately in order to prevent an evaporation material from being adhered to the electrode, and there is no particular limitation on the shape of the electrode cover. For example, the electrode may have a rectangular shape, a polygonal shape, or a columnar shape. When the electrode is columnar, an electrode cover may be provided so as to cover a face on the evaporation source side of the electrode. Preferably, the electrode cover may be provided to cover more portions than half of the side face of the columnar electrode.

In addition, FIGS. 1A to 1D show that the upper part and the middle part of the electrode have the same cross sectional shape; however, the size and shape of each part of the electrode may be different. For example, the upper part of the electrode may be smaller than the middle part of the electrode. In that case, the electrode cover is preferably provided to cover a face between the middle part and the upper part of the electrode.

Providing an electrode cover of the present invention allows maintenance of an evaporation device to be easier, since the electrode cover can be detached in order to remove an evaporation material adhered to electrodes. Further, since maintenance becomes easy, the process time can be shortened, which leads to increase in productivity of products which are manufactured with the evaporation device.

Embodiment Mode 2

Figure 10A:
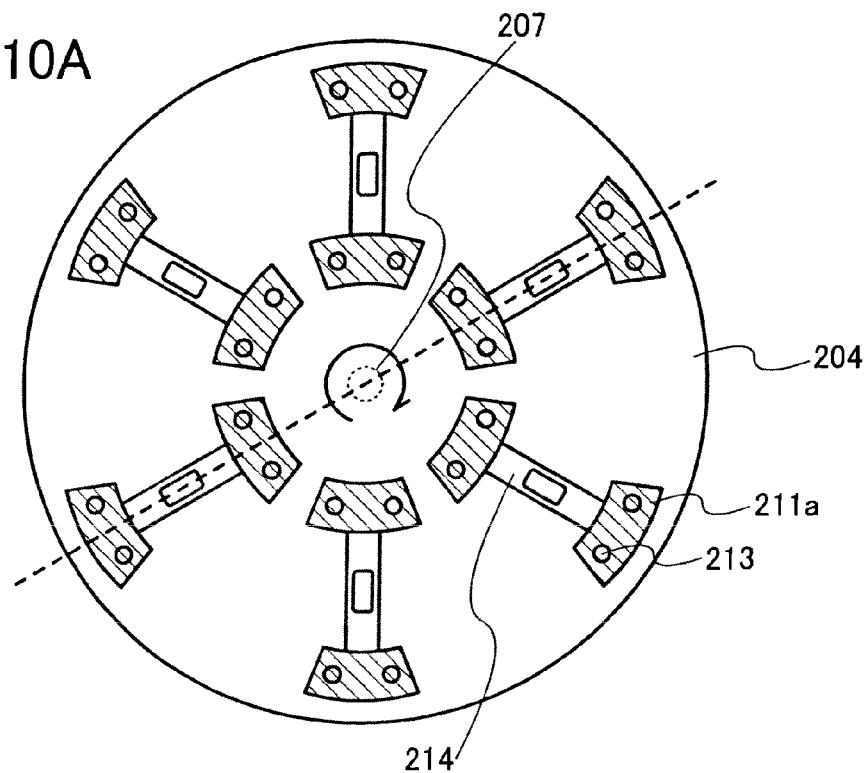
FIGS. 10A and 10B are views explaining an evaporation device according to an aspect of the present invention.
Figure 10B:
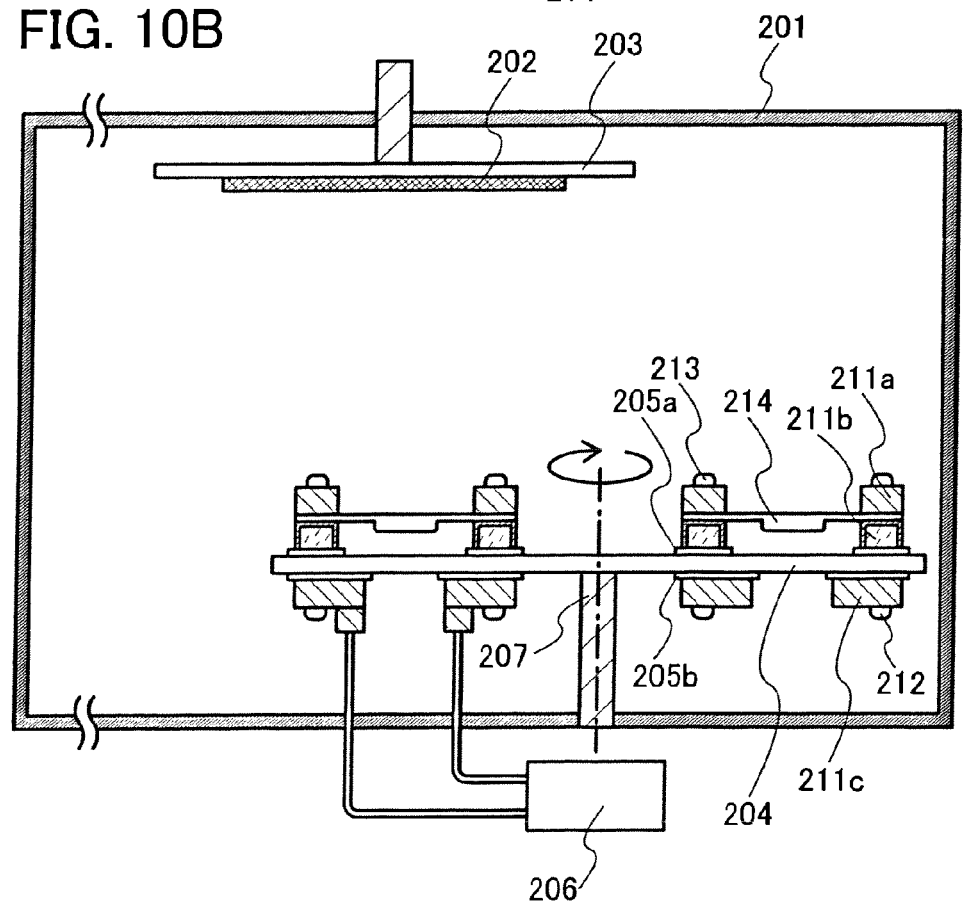

Embodiment Mode 2 will describe an evaporation device having a plurality of evaporation sources with reference to FIGS. 10A and 10B.

In FIGS. 10A and 10B, an evaporation device has a holding portion 203 which holds an object to be treated 202, a plate 204 on which an evaporation source holder is set, and the evaporation source holder 214 in an evaporation chamber 201. The evaporation source holder 214 is electrically connected to a pair of electrodes. Of the electrodes, a middle part 211b of the electrode and a lower part 211c of the electrode are fixed on the plate 204 on which the evaporation source holder is set, with a screw 212. The middle part 211b of the electrode and the lower part 211c of the electrode are electrically connected to each other by the screw 112. The evaporation source holder 214 holding an evaporation material or an end portion of the evaporation source holder comprising the evaporation material is interposed between an upper part 211a of the electrode and the middle part 211b of the electrode, whereby the evaporation source holder 214 can be held. In addition, the electrodes and the evaporation source holder 214 can be electrically connected. The lower part 211c of the electrode which is fixed on the plate 204 on which the evaporation source holder is set can be connected to a power supply 206.

When the plate 204 on which the evaporation source holder is set comprises a conductive material, an insulating plate 205a is provided between the plate 204 and the middle part 211b of the electrode, and an insulating plate 205b is provided between the plate 204 and the lower part 211c of the electrode. The insulating plates 205a and 205b can prevent a short-circuit between the pair of electrodes via plate 204.

In the evaporation device shown in FIGS. 10A and 10B, the plate 204 on which the evaporation source holders are set has a circular shape, and a plurality of evaporation source holders are arranged in a radial pattern. The circular shaped plate 204 has a rotation axis 207. Rotation around the rotation axis 207 makes it possible to move the evaporation sources to a desired position and to connect them to the power supply 206. The pair of electrodes connected to the evaporation source holders may have the same shape or may have different shapes. In addition, each of the electrodes is provided with an electrode cover so that the side face of the electrode fronting the evaporation source is covered.

When a plurality of evaporation sources are disposed in this manner in an evaporation device, the number of electrodes is large, and a lot of time for maintenance work is required. However, the use of an electrode cover of the present invention can shorten the time for the maintenance work. Further, a plate on which a plurality of evaporation source holders are set weighs more, and thus there has been a difficulty in maintenance work. However, the use of an electrode cover of the present invention can drastically reduce the maintenance work.

Embodiment Mode 3

Figure 11:
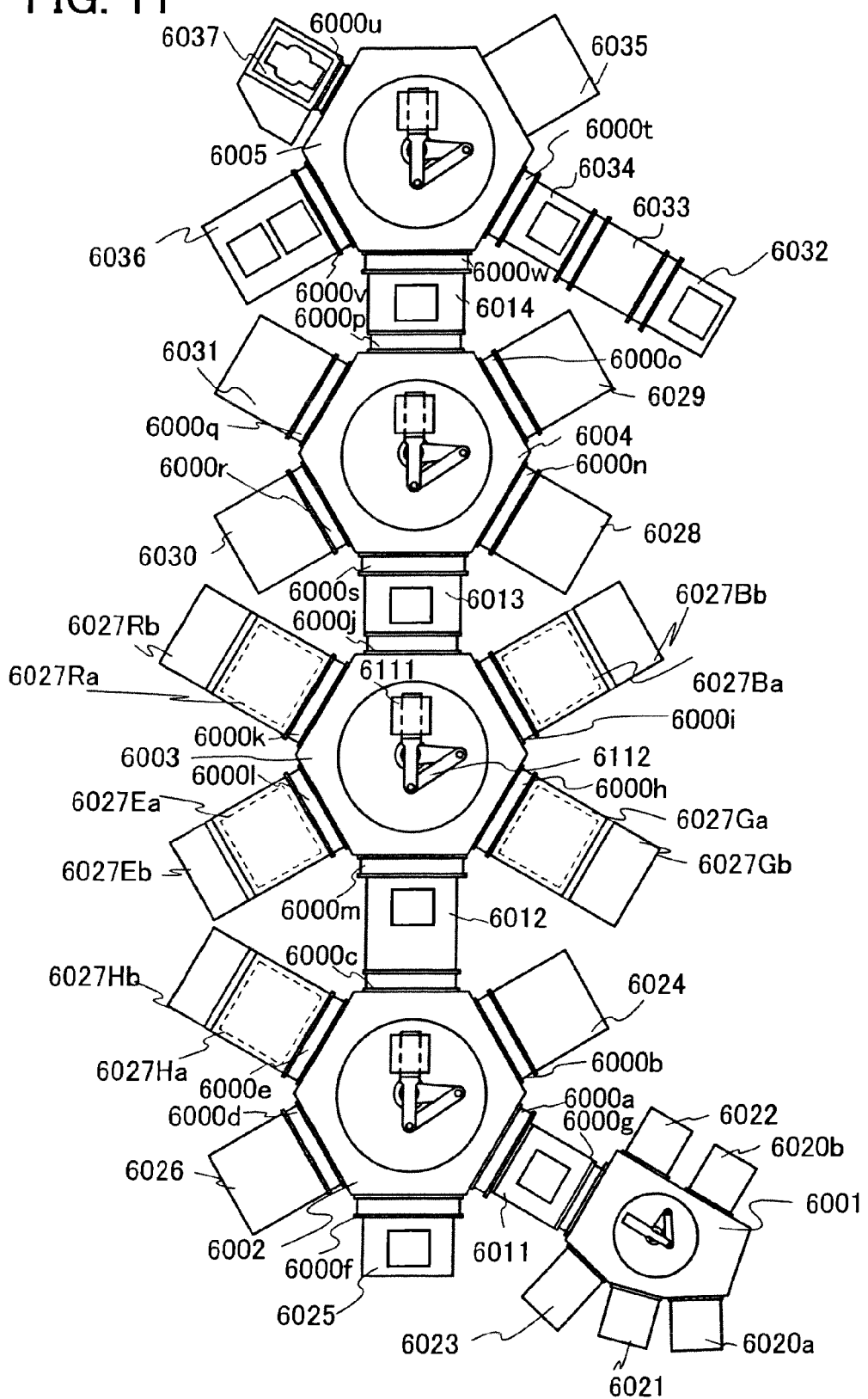
FIG. 11 is a view explaining a manufacturing apparatus according to an aspect of the present invention.

Embodiment Mode 3 will describe one mode of a manufacturing apparatus having a plurality of evaporation chambers and a method of manufacturing a light emitting device using the manufacturing apparatus with reference to FIG. 11.

Specifically, a multi-chamber system manufacturing apparatus and a manufacturing method with the multi-chamber system will be described. In the manufacturing apparatus, a substrate 6111, which has been provided with a thin film transistor, an anode (a first electrode), an insulator covering an end portion of the anode or the like in advance, is introduced and a treatment such as deposition is continuously conducted; then, attached together with an opposing substrate which is introduced separately from the substrate, a sealing treatment is conducted; and accordingly, a panel is completed.

FIG. 11 shows a multi-chamber system manufacturing apparatus including the following: gates 6000a to 6000w, transfer chambers 6001 to 6005 (each including a transfer robot 6112 for transferring a substrate), a stock chamber 6011, delivery chambers 6012 to 6014, cassette chambers 6020a and 6020b, a tray mounting stage 6021, a deposition chamber 6022, a substrate heating chamber 6023, a substrate/mask stock chamber 6024, a pretreatment chamber 6025, a substrate heating chamber 6026, evaporation chambers 6027Ha (EL layer: HTL, HIL), 6027Ra (EL layer: R), 6027Ga (EL layer: G), 6027Ba (EL layer: B), and 6027Ea (EL layer: ETL, EIL), evaporation anterior chambers 6027Hb, 6027Rb, 6027Gb, 6027Bb, and 6027Eb in which evaporation sources are set, evaporation chambers 6028 and 6029, sputtering chambers 6030 and 6031, a $N_2$ displacement chamber (for an opposing glass substrate) 6032, a glove box 6033, a preparation chamber 6034, a substrate/opposing-substrate stock chamber 6035, a sealing chamber 6036, and a chamber for taking out 6037.

A cassette storing a substrate is put in the cassette chamber 6020a or the cassette chamber 6020b.

Metal masks used in a total of 10 chambers of the pretreatment chamber 6025, the evaporation chambers 6027Ha, 6027Ra, 6027Ba, and 6027Ga, the evaporation chambers 6028 and 6029, and the sputtering chambers 6030 and 6031 are set in the substrate/mask stock chamber 6024.

A heater (a sheath heater or the like) provided in the pretreatment chamber 6025 or the substrate heating chamber 6026 can heat a substrate. In order to completely remove water and other gases contained in the substrate, annealing for degassing is performed in a vacuum (less than or equal to $5 \times 10^{-3}$ torr (0.665 Pa), preferably $10^{-4}$ to $10^{-6}$ Pa). In particular, when an organic resin film is used as a material of an interlayer insulating film or a partition wall, certain organic resin materials may absorb water easily and may further cause degassing. Therefore, it is effective to perform vacuum heating before forming an EL layer, in which heating is performed at 100° C. to 250° C., preferably at 150° C. to 200° C., for 30 minutes or more and then natural-cooling is performed for 30 minutes to remove absorbed water.

Subsequently, after the vacuum heating, the substrate is transferred from the transfer chamber 6002 to the evaporation chamber 6027Ha, where vacuum evaporation is performed to form a hole injecting layer and/or a hole transporting layer. Then, the substrate is transferred from the transfer chamber 6002 to the transfer chamber 6003 which is constantly maintained under a vacuum through the delivery chamber 6012, which is constantly maintained under a vacuum.

Then, the substrate is transferred to the evaporation chambers 6027Ra, 6027Ga, 6027Ba, and 6027Ea connected to the transfer chamber 6003 appropriately, where each layer of a red light emitting layer, a green light emitting layer, a blue light emitting layer, and an electron transporting layer, an electron injecting layer or the like, is formed using a vacuum evaporation method. Here, the evaporation chambers 6027Ha, 6027Ra, 6027Ga, 6027Ba, and 6027Ea are described below.

Each of the evaporation chambers 6027Ha, 6027Ra, 6027Ga, 6027Ba, and 6027Ea is provided with an evaporation source holder on which a plurality of evaporations sources can be set, and electrodes. Multi-source co-evaporation can also be easily performed. In addition, each evaporation source is provided with an evaporation source shutter to control whether to actually evaporate a material by opening and closing of the shutter.

It is preferable to use the following manufacturing system when evaporation materials are set in the evaporation chambers. In other words, it is preferable to use containers (typically, such as a crucible and a boat) in which the evaporation material is stored in advance by a material manufacturer for deposition. It is also preferable to provide the evaporation material without being exposed to the atmosphere, and it is preferable to put the crucible into the deposition chamber as the crucible is sealed in a second container during transportation from the material manufacturer. It is desirable that the evaporation anterior chambers 6027Hb, 6027Rb, 6027Gb, 6027Bb, and 6027Eb which have vacuum exhaust means and are connected to the evaporation chambers 6027Ha, 6027Ra, 6027Ga, 6027Ba, and 6027Ea be maintained under a vacuum or an inert gas atmosphere, in which the crucible is taken out from the second container and set in the evaporation source holder of the evaporation chamber. Thus, the evaporation material can be set in the evaporation source without exposing each of the evaporation chambers 6027Ha, 6027Ra, 6027Ga, 6027Ba, and 6027Ea to the atmosphere, and further the crucible and the evaporation material contained in the crucible can be maintained in a clean condition until immediately before evaporation.

In addition, in the evaporation chamber, the electrode is covered with an electrode cover of the present invention shown in Embodiment Mode 1 to prevent adhesion of the evaporation material to the electrodes. Therefore, in a large manufacturing apparatus as shown in this embodiment mode, maintenance work can be reduced and productivity is improved.

Appropriate selection of evaporation materials to be used in the evaporation chambers 6027Ha, 6027Ra, 6027Ga, 6027Ba, and 6027Ea makes it possible to form a light emitting device that exhibits single-color (for example, white) or full-color (red, green, and blue) light emission in the whole light emitting device.

After the EL layers are formed appropriately in the above steps, the substrate is transferred from the transfer chamber 6003 to the transfer chamber 6004, which is constantly maintained in a vacuum, through the delivery chamber 6013 which is constantly maintained in a vacuum.

Subsequently, a cathode (a second electrode) is formed. In a case in which the cathode is formed as a reflective electrode, an element which belongs to the first group or the second group of the periodical table, that is, an alkaline metal such as Li (lithium) or Cs (cesium), an alkaline earth metal such as Mg (magnesium), Ca (calcium), or Sr (strontium), an alloy thereof (MgAg and AlLi), an rare earth metal such as Eu (europium) or Yb (ytterbium), or an alloy thereof can be used. For example, Al (aluminum) may be formed by a vacuum evaporation method using resistance heating in the evaporation chamber 6028 or 6029, or alternatively can be formed by a sputtering method in the sputtering chamber 6030 or 6031.

Lastly, a calcium fluoride (abbreviation: $CaF_2$) or zinc oxide (abbreviation: ZnO) transparent protective film is formed in the evaporation chamber 6028 or 6029.

In addition, in the evaporation chamber, the electrode is covered with an electrode cover of the present invention shown in Embodiment Mode 1 to prevent adhesion of the evaporation material to the electrodes. Therefore, in a large manufacturing apparatus as shown in this embodiment mode, maintenance work can be reduced and productivity is improved.

The light emitting element with a multilayer structure is formed through the above steps.

Subsequently, the substrate over which a light emitting element is formed is sealed in the sealing chamber 6036 and thus, a panel is completed. The thus completed panel is transferred to the chamber for taking out 6037 through the transfer chamber 6005 and is taken out.

The use of the manufacturing apparatus in the above procedure makes it possible to manufacture a light emitting device.

The manufacturing apparatus shown in this embodiment mode is a large manufacturing apparatus having a plurality of evaporation chambers. In the case of such a large manufacturing apparatus, maintenance work is much harder than that of a small manufacturing apparatus. However, the use of an electrode cover of the present invention can drastically reduce the maintenance work. In addition, the time for the maintenance work is shortened, and therefore productivity is improved.

This application is based on Japanese Patent Application Ser. No. 2006-126794 filed in Japan Patent Office on Apr. 28, 2006, the entire contents of which are hereby incorporated by reference.

What is claimed is:

1. An evaporation device comprising:
   a conductive plate;
   an insulating plate over and in contact with the conductive plate;
   a first electrode over and in contact with the insulating plate, the first electrode comprising an upper surface and a first side surface; and
   a second electrode over the first electrode,
   wherein the evaporation device is configured so that the first electrode is covered by an electrode cover comprising first and second portions,
   wherein the first portion is configured to be in direct contact with the first side surface which faces to an evaporation source holder,
   wherein the second portion is configured to be in direct contact with the upper surface, to hold the evaporation source holder by sandwiching the evaporation source holder with the second electrode, and to electrically connect the evaporation source holder to the first electrode, and
   wherein the electrode cover is configured to fully expose a side surface of the first electrode other than the first side surface when the electrode cover covers the first electrode,
   wherein the electrode cover is further configured so that an outer surface of the first portion and a side surface which faces the evaporation source holder of the insulating plate exist in a coplane when the electrode cover covers the first electrode, and
   wherein the electrode cover is further configured so that the first portion contacts with an upper surface of the insulating plate when the electrode cover covers the first electrode.

2. The evaporation device according to claim 1,
   wherein the evaporation source holder is configured to hold any of an inorganic compound and an organic compound.

3. The evaporation device according to claim 1,
   wherein the insulating plate protrudes from the conductive plate to provide a region which does not overlap with the conductive plate.

4. The evaporation device according to claim 1, further comprising a plate for preventing attachment of a material held in the evaporation source holder,
   wherein the plate is located over and in contact with the insulating plate.

5. The evaporation device according to claim 4,
   wherein the insulating plate protrudes from the conductive plate to provide a region which does not overlap with the conductive plate, and
   wherein the plate is in contact with the region.

6. The evaporation device according to claim 1, further comprising a holding portion over the second electrode,
   wherein the holding portion is configured to hold a substrate, and
   wherein the conductive plate is configured to rotate about an axis whose vector does not pass the substrate.

7. The evaporation device according to claim 1,
   wherein the first electrode is configured to be fixed to the conductive plate with a first screw.

8. The evaporation device according to claim 1,
   wherein the second electrode is configured to be fixed to the first electrode with a second screw.

9. An evaporation device comprising:
   a conductive plate;
   an insulating plate over and in contact with the conductive plate;
   a first electrode over and in contact with the insulating plate, the first electrode comprising an upper surface and first to fourth side surfaces; and
   a second electrode over the first electrode,
   wherein the evaporation device is configured so that the first electrode is covered by an electrode cover comprising first to fourth portions, wherein the first portion is configured to be in direct contact with the first side surface which faces to an evaporation source holder, wherein the second portion is configured to be in direct contact with the upper surface, to hold the evaporation source holder by sandwiching the evaporation source holder with the second electrode, and to electrically connect the evaporation source holder to the first electrode, wherein the third portion is configured to be in direct contact with the second side surface which is connected to the first side surface, wherein the fourth portion is configured to be in direct contact with the third side surface which is connected to the first side surface, wherein the electrode cover is configured so that the fourth side surface is exposed when the electrode cover covers the first electrode, and wherein the fourth side surface is connected to the second side surface and the third side surface, wherein the electrode cover is further configured so that an outer surface of the first portion and a side surface which faces the evaporation source holder of the insulating plate exist in a coplane when the electrode cover covers the first electrode, and wherein the electrode cover is further configured so that the first portion contacts with an upper surface of the insulating plate when the electrode cover covers the first electrode.

10. The evaporation device according to claim 9,
wherein the evaporation source holder is configured to hold any of an inorganic compound and an organic compound.

11. The evaporation device according to claim 9,
wherein the insulating plate protrudes from the conductive plate to provide a region which does not overlap with the conductive plate.

12. The evaporation device according to claim 9, further comprising a plate for preventing attachment of a material held in the evaporation source holder,
wherein the plate is located over and in contact with the insulating plate.

13. The evaporation device according to claim 12,
wherein the insulating plate protrudes from the conductive plate to provide a region which does not overlap with the conductive plate, and
wherein the plate is in contact with the region.

14. The evaporation device according to claim 9, further comprising a holding portion over the second electrode,
wherein the holding portion is configured to hold a substrate, and
wherein the conductive plate is configured to rotate about an axis whose vector does not pass the substrate.

15. The evaporation device according to claim 9,
wherein the first electrode is configured to be fixed to the conductive plate with a first screw.

16. The evaporation device according to claim 9,
wherein the second electrode is configured to be fixed to the first electrode with a second screw.

* * * * *